(12) United States Patent
Iwase et al.

(10) Patent No.: US 6,721,163 B2
(45) Date of Patent: Apr. 13, 2004

(54) STACKED CERAMIC BODY AND PRODUCTION METHOD THEREOF

(75) Inventors: Akio Iwase, Nishio (JP); Yukihisa Takeuchi, Chita-gun (JP); Tetuji Ito, Kariya (JP)

(73) Assignee: Denso Corporation, Aichi-Pref (JP)

( * ) Notice: Subject to any disclaimer, the term of this patent is extended or adjusted under 35 U.S.C. 154(b) by 0 days.

(21) Appl. No.: 10/310,062

(22) Filed: Dec. 5, 2002

(65) Prior Publication Data

US 2003/0107867 A1 Jun. 12, 2003

(30) Foreign Application Priority Data

Dec. 6, 2001 (JP) ......................................... 2001-373008

(51) Int. Cl.⁷ ................................................ H01G 4/30
(52) U.S. Cl. ................................ 361/301.4; 361/306.1; 361/306.3
(58) Field of Search ........................... 361/301.4, 306.1, 361/306.3, 321.2, 301.1

(56) References Cited

U.S. PATENT DOCUMENTS 4,584,074 A * 4/1986 Sterling et al. ............. 204/487
5,550,705 A * 8/1996 Moncrieff ................... 361/313

FOREIGN PATENT DOCUMENTS

| JP | 61142780 | 6/1986 |
| JP | 63009168 | 1/1988 |
| JP | 02035785 | 2/1990 |

* cited by examiner

*Primary Examiner*—Anthony Dinkins
(74) *Attorney, Agent, or Firm*—Nixon & Vanderhye P.C.

(57) ABSTRACT

This invention provides a stacked ceramic body in which de-lamination (inter-layer peeling) does not easily occur, and a production method thereof. In the invention, a predetermined number of unit layers 151 and 152 each including a ceramic layer 111 112, an internal electrode layer 121, 122, a spacer 131, 132 having substantially the same thickness as the internal electrode layer 121, 122 and adhesive layers 14 stacked on the surface of the internal electrode layer and on the surface of the adhesive layer are stacked. A print portion for the internal electrode layer 121, 122 and a print portion for the spacer 131, 132 are formed on a green sheet for the ceramic layer 111, 112, and print portions for the adhesive layer 14 are formed on both of them to give an unsintered unit. The unsintered units are stacked to give an unsintered stacked body, are press-bonded and are then sintered.

2 Claims, 12 Drawing Sheets

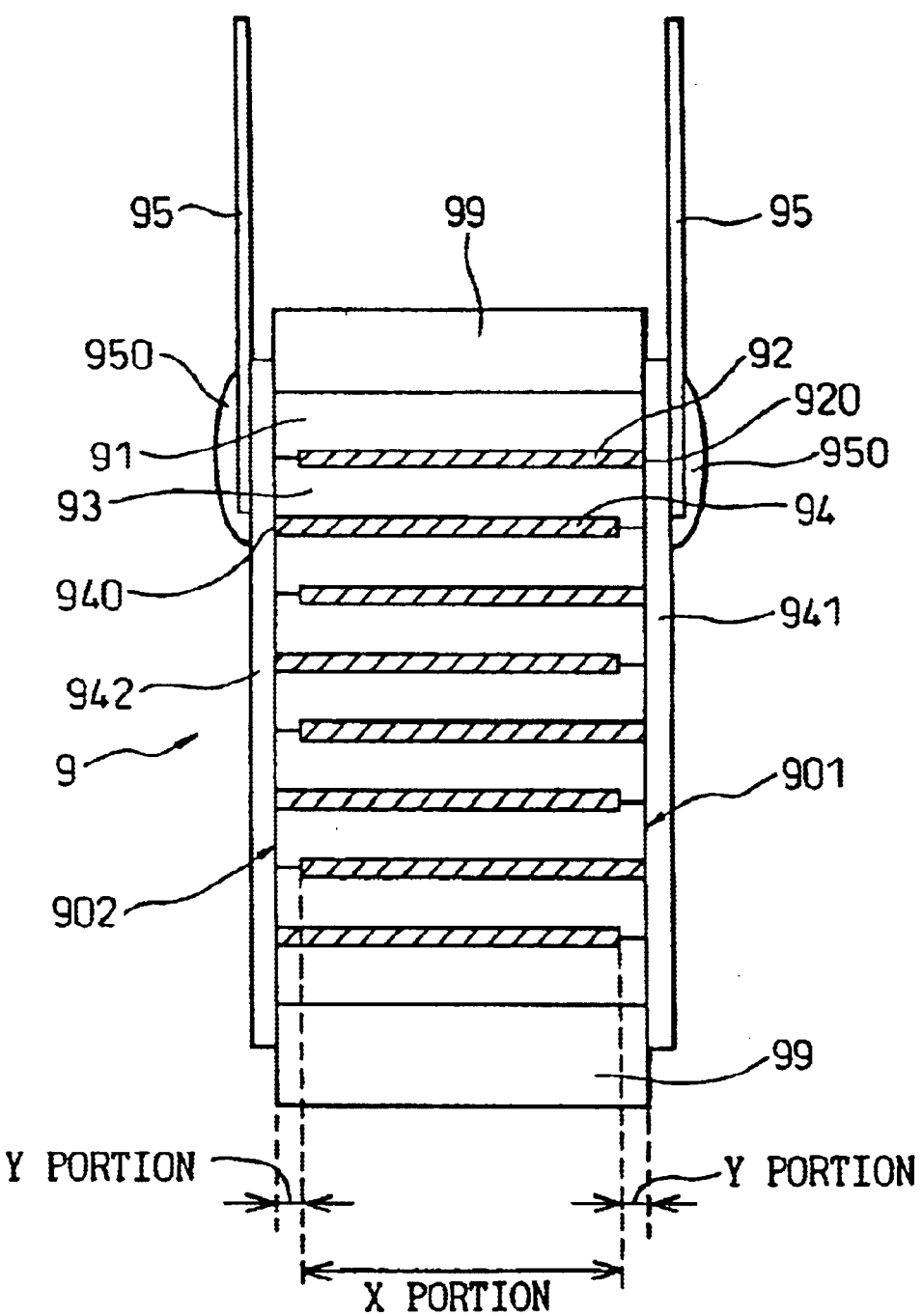

STACKED CERAMIC BODY AND PRODUCTION METHOD THEREOF

BACKGROUND OF THE INVENTION

1. Field of the Invention

This invention relates to a stacked ceramic body, including ceramic layers and internal electrode layers that are alternately stacked with one another, that can be utilized as a piezoelectric device or a stacked ceramic capacitor.

2. Description of the Related Art

A stacked ceramic body produced by alternately stacking ceramic layers, containing a piezoelectric material and a dielectric material, and internal electrode layers, containing an electrode material, with one another can be widely utilized as a piezoelectric device and a stacked ceramic capacitor.

FIG. 19 of the accompanying drawings shows an example of a known stacked ceramic body. Ceramic layers 91 and 93 and internal electrode layers 92 and 94 are alternately stacked with one another as shown in the drawing. In this stacked ceramic body 9, right and left end faces 920 and 940 of the internal electrode layers 92 and 94 are respectively exposed on the right and left side surfaces 901 and 902. Dummy layers 99 are respectively stacked on the upper and lower ends in the stacking direction.

The stacked ceramic body 9 includes a right side surface electrode 941 electrically connected to the internal electrode layer 92 exposed on the right side surface 901, and a lead wire 95 connected to the right side surface electrode 941 through an electrically conductive paste 950. The stacked ceramic body 9 includes also a left side surface electrode 942 electrically connected to the internal electrode layer 94 exposed on the left side surface 902, and a lead wire 94 connected to the left side surface electrode 902 through the conductive paste 950. When the lead wires 95 are connected to an external power source (not shown in the drawing), voltages are applied to each ceramic layer 91, 93.

The stacked ceramic body 9 described above is produced in the following way.

A print portion for the internal electrode layer is printed on a green sheet for the ceramic layer either rightward (having a right end portion exposed on the right side surface after stacking) or leftward (having a left end portion exposed on the left side surface after stacking). A predetermined number of green sheets are stacked to give an unsintered stacked body.

The unsintered stacked body is introduced into a press-bond jig and is heated at 80° C. to mutually press-bond the green sheet for the ceramic layer and the print portion for the internal electrode layer. Thereafter, degreasing, sintering, machining into a predetermined size, fitting of side surface electrodes, insulation, and so forth, are carried out to give the stacked ceramic body 9 shown in FIG. 19.

In a multi-stacked ceramic body having as many as hundreds of stacked layers, however, a difference of thickness reaching several millimeters occurs in some cases between each Y portion at which ceramic layers 91 and 93 are adjacent to each other in the stacking direction and an X portion at which the ceramic layers 91 and 93 are adjacent to each other through the internal electrode layers 92 and 94 as shown in FIG. 19.

Assuming that the number of the ceramic layers 91 and 93 is 500 and the thickness of the internal electrode layers 92 and 94 are 5 $\mu$m, the difference of the thickness between the X portion and the Y portion is as great as 2.5 mm.

The difference of the thickness between the X portion and the Y portion has been absorbed in the past by inter-layer press-bonding of the green sheet and the print portion at the time of the unsintered stacked body. However, when the number of ceramic layers is as great as several hundred, inter-layer press-bonding cannot sufficiently absorb the difference.

In the stacked ceramic body sintered while inter-layer adhesion of the green sheet and the print portion is not sufficient, de-lamination (inter-layer peeling) is likely to develop.

Particularly in the case of a thin, stacked ceramic body having hundreds of thin ceramic layers stacked on one another, vigorous de-lamination such as cleavage of the ceramic layers from the side surface of the stacked ceramic body occurs.

It may be possible to employ a method that elevates the pressure in the press-bonding operation of the unsintered stacked body to prevent de-lamination, but the green sheet is likely to be broken. When the unsintered stacked body containing the damaged green sheet is sintered, cracks may develop inside the stacked ceramic body.

SUMMARY OF THE INVENTION

In view of the problems with the prior art technologies, this invention aims at providing a stacked ceramic body in which de-lamination (inter-layer peeling) does not easily occur, and a production method thereof.

According to a first aspect of the invention, there is provided a stacked ceramic body comprising a predetermined number of unit layers, each of the unit layers including a ceramic layer, an internal electrode layer stacked on at least a part of a surface of the ceramic layer, a spacer stacked on a surface of the ceramic layer at which the internal electrode layer is not formed, and having substantially the same thickness as the internal electrode layer, and adhesive layers stacked on a surface of the internal electrode layer and on a surface of the spacer.

Next, the operation and effect of the invention will be explained.

In the stacked ceramic body according to the first invention, the internal electrode layer and the spacer each having substantially the same thickness are stacked on the ceramic layer, and the adhesive layers are stacked on both the internal electrode layers and the spacers. Other ceramic layers are then stacked through the adhesive layers.

Therefore, the stacked ceramic body has a uniform thickness as a whole, and a partial difference of thickness does not easily occur. The adhesive layer ensures bonding between the ceramic layers. The adhesive layer can also absorb the difference of thickness between the internal electrode layer and the spacer.

The first invention described above can provide a stacked ceramic body in which de-lamination (inter-layer peeling) does not easily occur.

According to a second aspect of the invention, there is provided a method for producing a stacked ceramic body by stacking a predetermined number of unit layers, each of the unit layers including a ceramic layer, an internal electrode layer stacked on at least a part of a surface of the ceramic layer, a spacer stacked on a surface of the ceramic layer at which the internal electrode layer is not formed, and having substantially the same thickness as the internal electrode layer, and adhesive layers stacked on a surface of the internal electrode layer and on a surface of the spacer, the method comprising the steps of preparing slurry for a ceramic layer, containing a ceramic material and a binder, slurry for an internal electrode layer, containing an electrode material and a binder, slurry for a spacer, containing a spacer material and a binder, and slurry for an adhesive layer, containing an adhesive layer material and a binder; a binder content in the slurry for the adhesive layer being higher than a binder content in the slurry for the ceramic layer; forming a green sheet for a ceramic layer from the slurry for the ceramic layer; forming a print portion for the internal electrode layer on the green sheet for the ceramic layer by use of the slurry for the internal electrode layer; forming a print portion for the spacer by use of the slurry for the spacer; forming and stacking a print portion for the adhesive layer on the print portions for the internal electrode layer and for the spacer by use of the slurry for the adhesive layer to give an unsintered unit; stacking a predetermined number of the unsintered units to give an unsintered stacked body; and pressing and bonding the unsintered stacked body and then sintering the unsintered stacked body.

According to a third aspect of the invention, there is provided a method for producing a stacked ceramic body by stacking a predetermined number of unit layers, each of the unit layers including a ceramic layer, an internal electrode layer stacked on at least a part of a surface of the ceramic layer, a spacer stacked on a surface of the ceramic layer at which the internal electrode layer is not formed, and having substantially the same thickness as the internal electrode layer, and adhesive layers stacked on a surface of the internal electrode layer and on a surface of the spacer, the method comprising the steps of: preparing slurry for a ceramic layer, containing a ceramic material and a binder, slurry for an internal electrode layer, containing an electrode material and a binder, slurry for a spacer, containing a spacer material and a binder, and slurry for an adhesive layer, containing an adhesive layer material and a binder; a binder content in the slurry for the adhesive layer being higher than a binder content in the slurry for the ceramic layer; forming a large-scale green sheet capable of providing a plurality of green sheets for the ceramic layer from the slurry for the ceramic layer;

forming a print portion for the internal electrode layer on the large-scale green sheet by use of the slurry for the internal electrode layer; forming a print portion for the spacer on the large-scale green sheet by use of the slurry for the spacer; forming and stacking a print portion for the adhesive layer on the print portions for the internal electrode layer and for the spacer by use of the slurry for the adhesive layer; punching the large-scale green sheet to give unsintered units; stacking and press-bonding the unsintered unit to other unsintered unit simultaneously with punching; repeating the formation, punching and press-bonding operations to give an unsintered stacked body; and sintering the unsintered stacked body.

Next, the operation and effect of the invention will be explained.

In the second invention, the unsintered stacked body is produced from the unsintered units each including the print portions for the internal electrode layer, for the spacer and for the adhesive layer that are formed on the green sheet. The unsintered stacked body is press-bonded and is then sintered.

In the third invention, each print portion is first formed on the large-scale green sheet and is then punched out to give the unsintered unit. The unsintered stacked boy is produced from the unsintered units and is then sintered. In this invention, the stacking and press-bonding operations of the unsintered units are carried out simultaneously with the punching-out operation.

In the production method according to the second and third inventions, the print portion for the internal electrode layer and the print portion for the spacer are formed on the green sheet as the ceramic layer, and the print portions for the adhesive layer are stacked on both of them. The binder content in the slurry for the adhesive layer is higher than the binder content in the slurry for the ceramic layer. Therefore, the green sheet as the ceramic layer can be firmly bonded to the print portion for the internal electrode layer and to the print portion for the spacer. The print portion for the adhesive layer can absorb the difference of thickness between the print portion for the internal electrode layer and the print portion for the spacer.

Therefore, in the stacked ceramic body obtained by the second and third production methods, the stacked ceramic body has a uniform thickness as a whole, and a partial difference of thickness does not easily occur. The adhesive layer strongly bonds the ceramic layers.

Because the slurry for the adhesive layer secures the bonding strength, it is not necessary to increase the bonding strength of the green sheet itself as the ceramic layer by increasing the binder amount of the slurry for the ceramic layer. In other words, the binder amount can be decreased. Furthermore, because sufficient degreasing need not be conducted by lowering the temperature rise rate during degreasing before sintering of the unsintered stacked body or degreasing at the time of sintering, the degreasing time and the sintering time can be shortened.

The third invention can particularly improve production efficiency because the press-bonding operation is carried out simultaneously with punching-out of the unsintered units.

The second and third inventions can provide a method for producing a stacked ceramic body in which de-lamination (inter-layer peeling) does not easily occur.

BRIEF DESCRIPTION OF THE DRAWINGS

FIG. 19 is a sectional explanatory view of a stacked ceramic body in a stacking direction according to the prior art.

DESCRIPTION OF THE PREFERRED EMBODIMENTS

Figure 1:
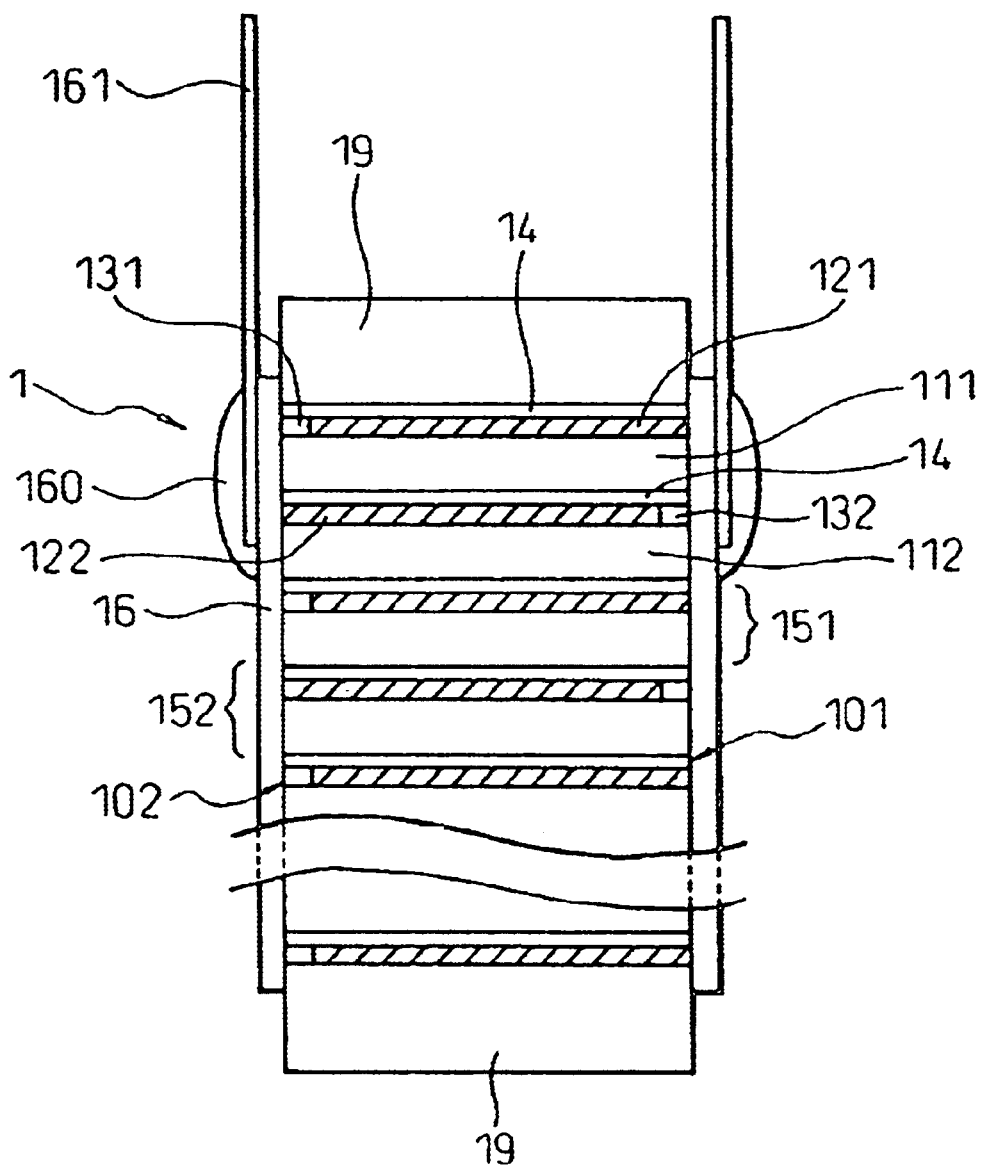
FIG. 1 is a sectional explanatory view of a stacked ceramic body in a stacking direction in Embodiment 1.

In the first invention, a surface of a ceramic layer is preferably covered as a whole with an internal electrode layer and a spacer. The surface of the internal electrode layer and that of the spacer are preferably covered as a whole with an adhesive layer. According to this construction, a stacking height of a stacked ceramic body becomes uniform and de-lamination does not easily occur.

Even if the height of the internal electrode layer is not strictly equal to that of the spacer, the operation and effect of the invention can be obtained provided that the difference remains at a level such that the adhesive layer can absorb the difference, in height, between them.

The adhesive layer preferably has the same composition as the ceramic layer. In this case, cracking and de-lamination resulting from the difference of the thermal shrinkage ratios of the different kinds of materials can be prevented.

For the same reason as described above, the spacer, too, preferably has the same composition as the ceramic layer.

In the second and third inventions, a binder content contained in 100 wt % of slurry for the adhesive layer is preferably 6 to 18 wt %.

When this condition is satisfied, it is possible to acquire strong bonding strength for sufficiently bonding the layers and to prevent easy occurrence of peel during sintering of an unsintered stacked body (inclusive of degreasing when degreasing is conducted). When the binder amount is appropriate, the sintering time (inclusive of the degreasing time when degreasing is conducted) is prevented from being elongated.

When the binder content is less than 6 wt %, peeling is likely to occur during sintering and when the binder content exceeds 18 wt %, the sintering time is elongated.

The content of the binder contained in 100 wt % of the slurry for the ceramic layer is preferably 3.5 to 8 wt %.

When this condition is satisfied, a strong bonding strength for sufficiently bonding the layers can be acquired, and peeling hardly occurs when the unsintered stacked body is sintered (inclusive of degreasing when degreasing is conducted). As the binder amount is appropriate, the sintering time (inclusive of the degreasing time when degreasing is conducted) is prevented from being elongated.

When the binder content is less than 3.5 wt %, peeling is likely to occur during sintering, and when the binder content exceeds 8 wt %, the sintering time is elongated.

Either the print portion for the spacer or the print portion for the internal electrode layer in the green sheet for the ceramic layer or the large-scale sheet may be printed first.

When the print portion for the spacer is provided to the green sheet for the ceramic layer or to the large-scale sheet, a plurality of printing portions may be collectively printed. Collective printing can also be made for the print portions for the internal electrode layer and for the print portions for the adhesive layer (see FIGS. 14 to 16).

The print portions described above can be printed into the same shape and the same size required for the unsintered stacked body. However, printing may be conducted to a size somewhat greater than the required size and the unnecessary portions may be removed later, or the necessary portion is cut out (see FIG. 9).

It is possible to form the printing portion for the adhesive layer after the print portion for the internal electrode layer and the print portion for the spacer are formed but before both print portions are dried, and to stack other unsintered units before the print portion for the adhesive layer is dried.

Because each print portion before drying has tackiness or adhesion, the print portions for the internal electrode layer, for the spacer and for the ceramic layer can be adhered and stacked more strongly.

The spacer and the adhesive layer are preferably integrated with each other.

In this case, the spacer and the adhesive layer integrally cover the internal electrode layer, and de-lamination does not easily occur at the boundary of the spacer, the adhesive layer and the internal electrode layer.

The press-bonding operation of the unsintered stacked body described above is preferably carried out at 50 to 500 g/cm$^2$.

The stack-bonding operation of the unsintered units is preferably carried out at 50 to 500 g/cm$^2$.

When the unsintered stacked body or the unsintered unit is pressed at the pressure within the range described above in the second and third inventions, particles for the adhesive layer material contained in the slurry for the adhesive layer cut into the print portions for the ceramic layer and for the internal electrode layers, and improve bonding strength between them.

When the pressure of the press-bonding operation and the stack-bonding operation is less than 50 g/cm$^2$, the catching force of the particles for the adhesive layer material is not sufficient, and mutual bonding strength is likely to drop. When the pressure exceeds 500 g/cm$^2$, the unsintered unit and the unsintered stacked body are likely to undergo deformation.

The mean particle diameter of the ceramic material described above is preferably from 0.3 to 2 $\mu$m.

In this case, it is possible to acquire a stacked ceramic body having sufficiently high mechanical strength.

When the mean particle diameter of the ceramic material is less than 0.3 $\mu$m, the output of a piezoelectric device is likely to drop when the stacked ceramic body is used as the piezoelectric device. When the mean particle diameter exceeds 2 $\mu$m, the mechanical characteristics of the stacked ceramic body are likely to deteriorate.

The mean particle diameter of the material for the adhesive layer is preferably from 0.3 to 3 $\mu$m.

When this condition is satisfied, the particles of the material for the adhesive layer contained in the adhesive layer cut into the unsintered unit or the unsintered stacked body in its stacking and bonding operation or its pressing and bonding operation, and sufficient mechanical strength can be obtained after sintering.

When the mean particle diameter of the material for the adhesive layer is less than 0.3 µm or greater than 3 µm, cutting of the particles of the adhesive layer material is not sufficient, and the bonding strength of the adhesive layer is likely to drop.

The slurry for the spacer is made of the same slurry as the slurry for the adhesive layer, and the print portion for the spacer and the print portion for the adhesive layer are preferably formed integrally with each other by using this slurry.

As the print portion for the adhesive layer and the print portion for the spacer can be simultaneously printed in this way, the number of production steps can be reduced by one, and energy and labor can be saved.

Since the adhesive layer and the spacer are integrated with each other and integrally cover the internal electrode layer, de-lamination does not easily occur at the boundary with the internal electrode layer.

Hereinafter, Examples of the invention will be explained with reference to the accompanying drawings.

EXAMPLE 1

A stacked ceramic body and a production method thereof will be explained with reference to FIGS. 1 to 12.

As shown in FIG. 1, a stacked ceramic body 1 of this example includes a predetermined number of unit layers 151 and 152 that are stacked. Each unit layer 151, 152 includes a ceramic layers 111, 112, an internal electrode layer 121, 122 stacked on at least a part of a surface of the ceramic layer 111, 112, a spacer 131, 132 stacked on the surface of the ceramic layer 111, 112 at which the internal electrode layer 121, 122 is not formed and having substantially the same thickness as that of the internal electrode layers 121, 122, and adhesive layers 14 stacked on the surface of the internal electrode layer 121, 122 and on the surface of the spacer 131, 132.

In the production method of the stacked ceramic body of this example, slurry for a ceramic layer, containing a ceramic material and a binder, slurry for an internal electrode layer, containing an electrode material and a binder, slurry for a spacer, containing a spacer material and a binder and slurry for an adhesive layer, containing an adhesive material layer and a binder are first prepared.

The binder content in the slurry for the adhesive layer is higher than the binder content in the slurry for the ceramic layer.

Figure 6:
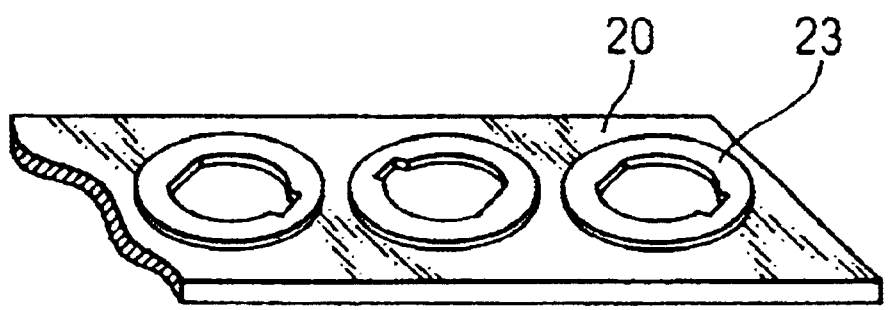
FIG. 6 is an explanatory view of a print portion for spacer in Embodiment 1.
Figure 7:
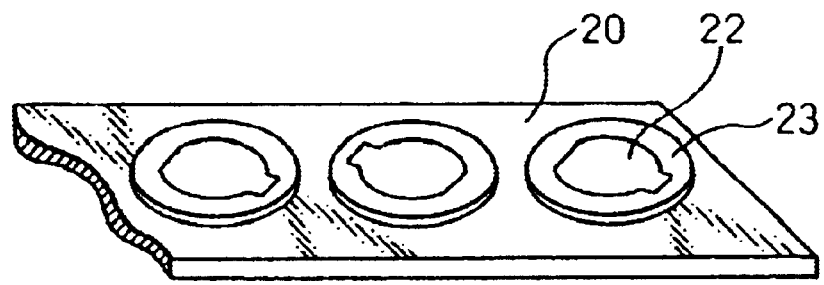
FIG. 7 is an explanatory view of a print portion for internal electrode layer in Embodiment 1.

A large-scale green sheet 20 capable of providing a plurality of green sheets for the ceramic layer is prepared from the slurry for the ceramic layer described above as shown in FIG. 5. Print portions 22 for the internal electrode layer are formed on the large-scale green sheet 20 by use of the slurry for the internal electrode layer, and print portions 23 for the spacer are formed by use of the slurry for the spacer as shown in FIGS. 6 and 7.

Figure 8:
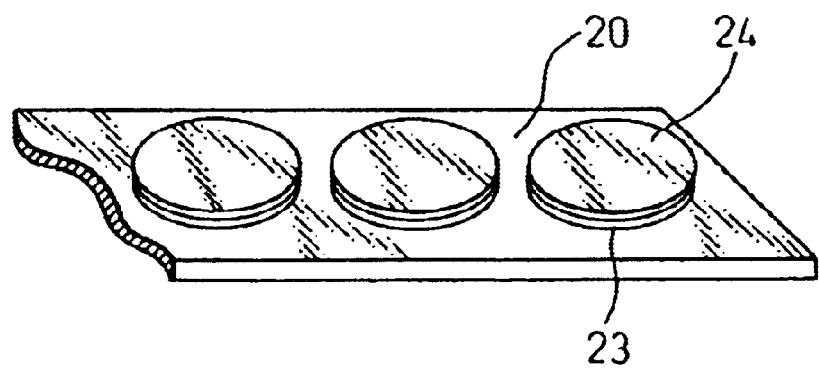
FIG. 8 is an explanatory view of a print portion for adhesive layer in Embodiment 1.
Figure 11:
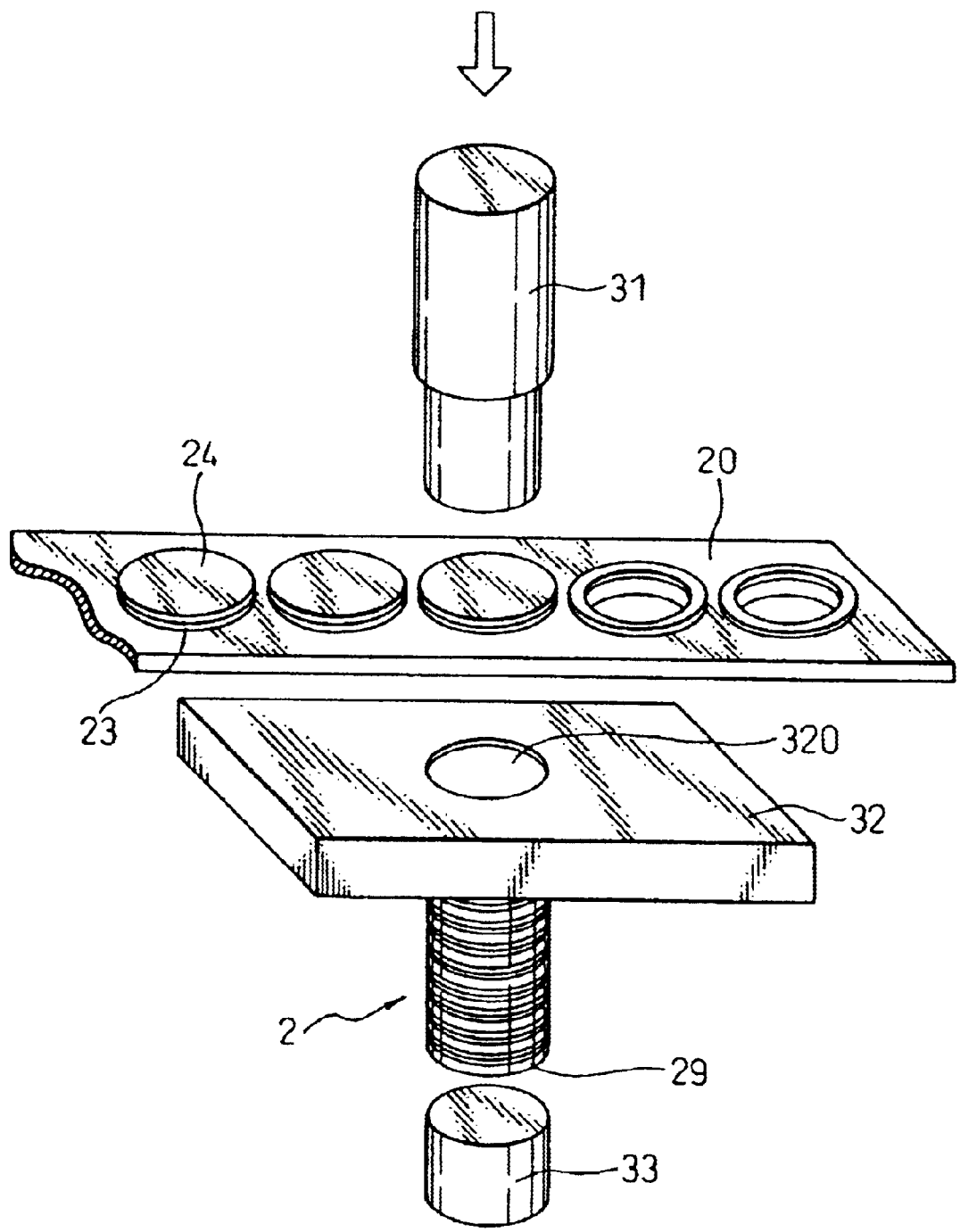
FIG. 11 is an explanatory view when stacking is carried out simultaneously with punching of unsintered units in Embodiment 1.

Next, as shown in FIG. 8, print portions 24 for the adhesive layer are formed by use of the slurry for the adhesive layer in such a fashion as to be stacked on the print portions 22 and 23 for the internal electrode layer and for the spacer. The green sheet 20 is then punched to give unsintered unit 25 as shown in FIG. 11. The unsintered unit 25 is stacked and press-bonded to another unsintered unit 25 simultaneously with punching. This process is repeated to obtain an unsintered stacked body 2.

Finally, the unsintered stacked body 2 is sintered to give the stacked ceramic body 1.

The explanation will be given in further detail.

The stacked ceramic body 1 of this example is used as a piezoelectric device for a piezoelectric actuator while positive and negative voltages are applied from the internal electrode layers 121 and 122 to the piezoelectric ceramic layers 111 and 112 to cause extension and contraction of the ceramic layers 111 and 112.

As shown in FIGS. 1 to 4, the stacked ceramic body 1 of this example is constituted by alternately stacking a large number of unit layers 151 and 152 each including the ceramic layer 111, 112, the internal electrode layer 121, 122 and the spacer 131 and 132 that are formed on the surface of the ceramic layer 111, 112, and the adhesive layers 14 applied to the surfaces of the internal electrode layer 121, 122 and the spacer 131, 32.

Figure 3:
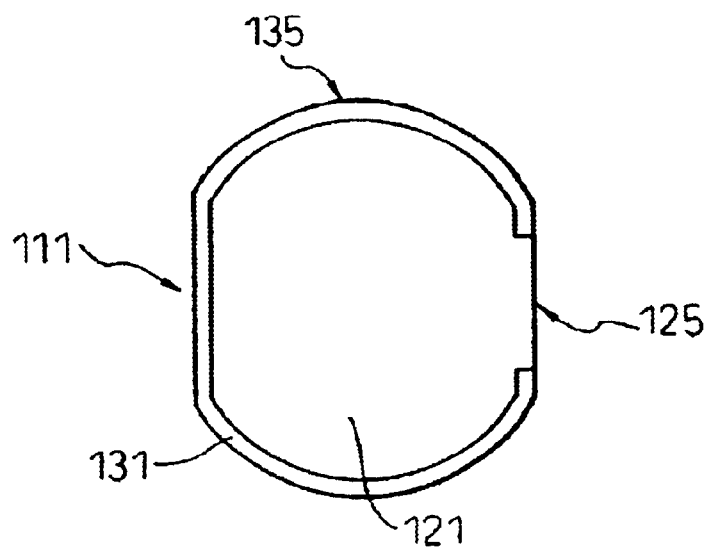
FIG. 3 is a plan view of a ceramic layer in which a right end face of an internal electrode layer is exposed, in Embodiment 1.
Figure 4:
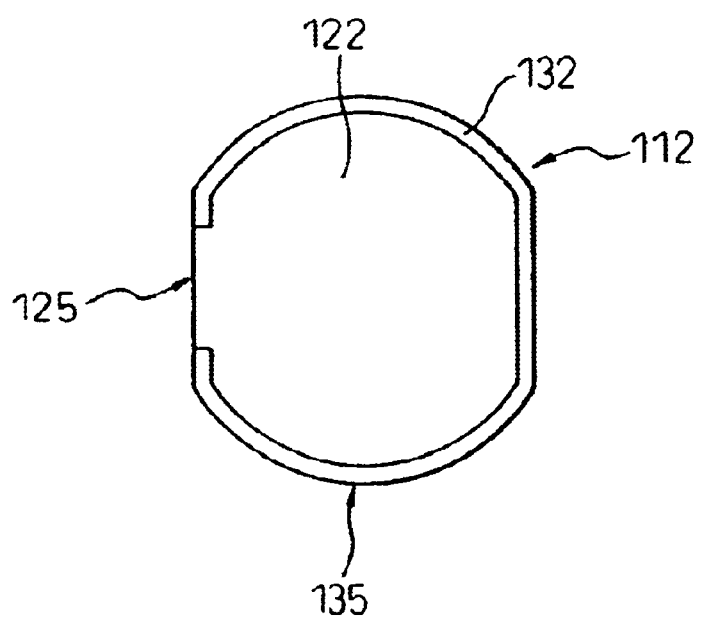
FIG. 4 is a plan view of a ceramic layer in which a left end face of an internal electrode layer is exposed in Embodiment 1.

The ceramic layer 111, 112 has a shape shown in FIGS. 3 and 4 (that is, a shape formed by cutting both sides of a circle). The spacer 131, 132 has a ring-like shape a part of an arc of which is cut off. The internal electrode layer 121, 122 has a shape that fills the inner circumference of the spacer 131, 132.

A side edge 125 of the internal electrode layer 121 disposed on the ceramic layer 111 is exposed to a planar right side surface 101 of the stacked ceramic body 1. A side edge 125 of the internal electrode layer 122 provided to the ceramic layer 112 is exposed to a planar left side surface 102 of the stacked ceramic body 1. A side edge 135 of the spacer 131, 132 is exposed on a curved side surface 105 of the stacked ceramic body 1.

Dummy layers 19 are arranged at both end portions of the stacked ceramic body 1 in the stacking direction. Both surfaces of each dummy layer 19 in the stacking direction are not sandwiched between the internal electrode layers 121 and 122, and cannot undergo extension and contraction when the voltages are applied to the internal electrode layers 121 and 122.

Figure 2:
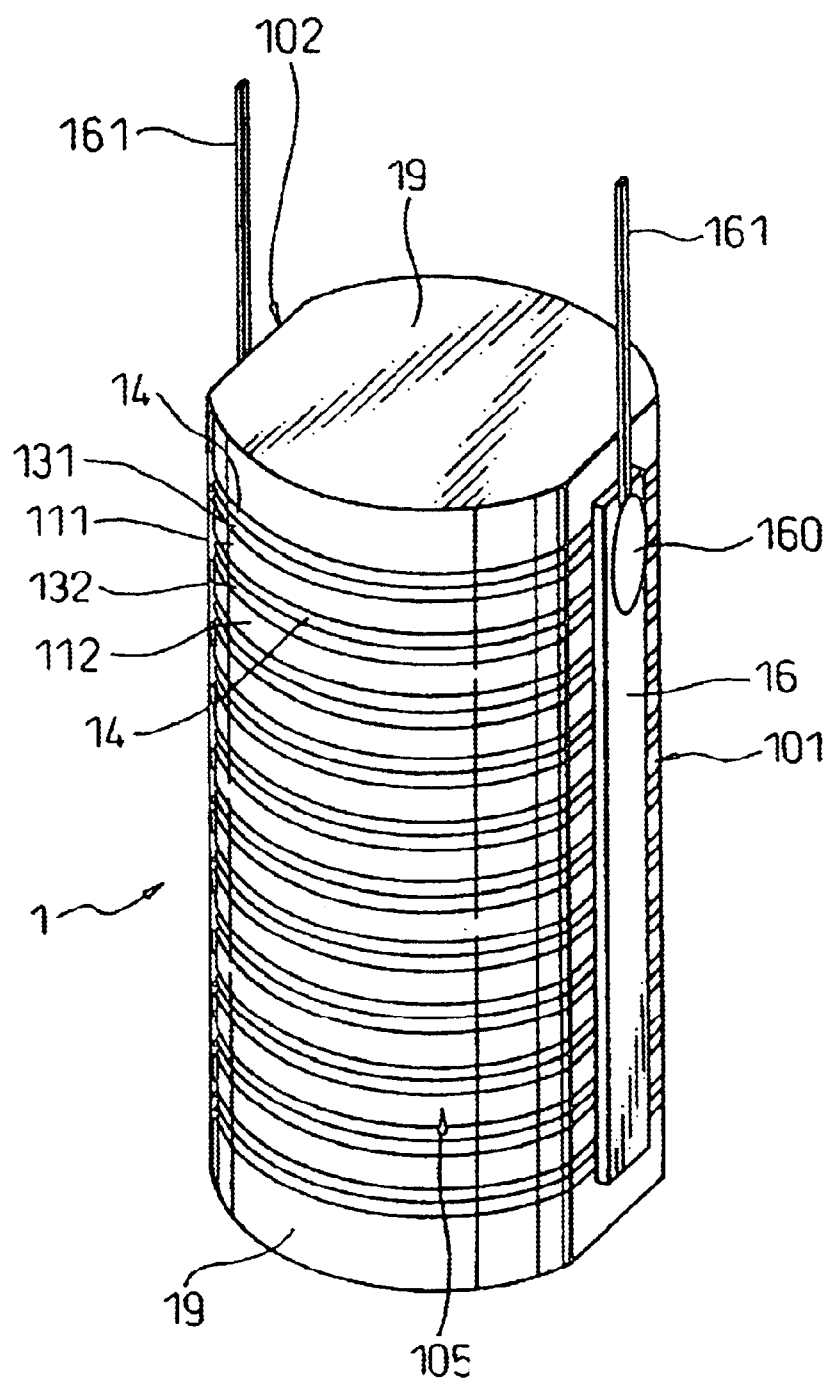
FIG. 2 is a perspective view of the stacked ceramic body in Embodiment 1.

FIGS. 1 and 2 are schematic views in which the number of the ceramic layers 111 and 112 is decreased and the thickness is smaller than the actual thickness so as to simplify illustration.

The internal electrode layer 121 is exposed on the side surface 101 of the stacked ceramic body 1. A side surface electrode 16 is so bonded as to electrically connect the internal electrode layer 121. A lead-out lead wire 161 is disposed above the side surface electrode 16 through an electrically conductive paste 160. This also holds true of the side surface 102.

The lead-out lead wire 16 is connected to an external power source not shown in the drawing. When voltages are applied from the external power source to the internal electrode layers 121 and 122, the voltages are applied to the ceramic layers 111 and 112. Consequently, the stacked ceramic body 1 undergoes extension and contraction in the stacking direction.

The ceramic layers 111 and 112 of this example are formed of PZT (lead zirconate titanate) and the internal electrode layers 121 and 122 contain Ag and Pd. The spacers 131 and 132 and the adhesive layers 14 are formed of PZT (lead zirco-titanate).

Next, the production method of the stacked ceramic body 1 of this example will be explained.

First, 100 g of a ceramic material consisting of PZT and having a mean particle diameter of 0.5 µm is prepared. Next, 40 g of a binder formed of PVB (polyvinyl butyral) is added to obtain slurry for the ceramic layer.

Figure 5:
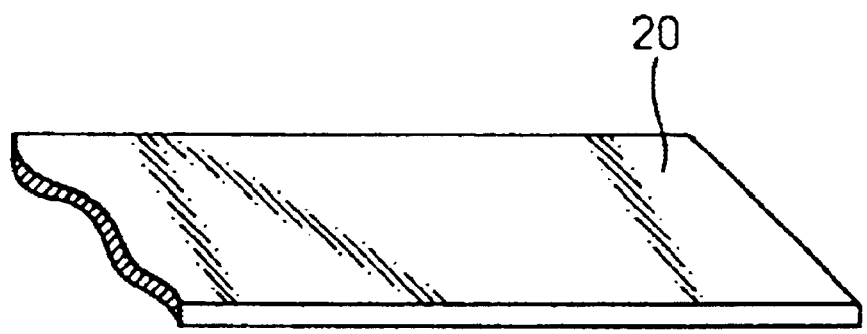
FIG. 5 is a perspective view of a large-scale green sheet in Embodiment 1.

The slurry so obtained is shaped by a doctor blade method to give a large-scale green sheet 20 having a thickness of 100 µm and a size of 100 mm by 110 mm as shown in FIG. 5.

Next, 1,000 g of an electrode material consisting of Pd and Ag and having a mean particle diameter of 0.5 µm is prepared. To this electrode material is added 40 g of a binder consisting of PVB to obtain slurry for the internal electrode layer.

On the other hand, 100 g of a spacer material consisting of PZT (the same as that of the slurry for the ceramic layer) and having a mean particle diameter of 0.5 µm is prepared. To this spacer material is added 8 g of a binder consisting of PVB to obtain slurry for the spacer.

Furthermore, 100 g of a material for the adhesive layer consisting of PZT (the same as the slurry for the ceramic layer) and having a mean particle diameter of 0.6 µm is prepared. To this spacer material is added 12 g of a binder consisting of PVB to obtain slurry for the adhesive layer.

Annular print portions 23 for the spacer are arranged from the slurry for the spacer on the large-scale green sheet 20 in a line in the longitudinal direction of the large-scale green sheet 20 as shown in FIG. 6.

The print portions 23 for the spacer are shaped into a size greater than the size of the unsintered unit 25 so that an excessive portion can be removed.

Next, the slurry for the internal electrode layer is filled into the inner circumference of the ring of the print portion 23 for the spacer as shown in FIG. 7, forming a print portion 22 for the internal electrode layer. Incidentally, the thickness of both print portions 22 and 23 is substantially equal and is 5 µm.

Thereafter, the print portion 24 for the adhesive layer is disposed to a thickness of 5 µm by using the slurry for the adhesive layer in such a fashion as to cover the surfaces of both print portions 22 and 23.

Figure 9:
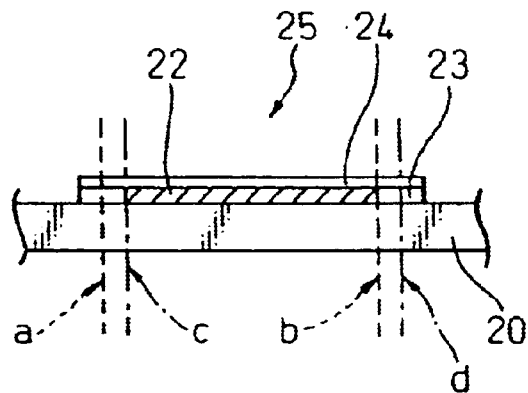
FIG. 9 is a schematic explanatory view of a large-scale green sheet for spacers, internal electrode layers and bonding layers in Embodiment 1.

FIG. 9 shows the sectional shape at this point of time. The inside range indicated by broken lines a and b or c and d is the respective unsintered unit 25.

Figure 10:
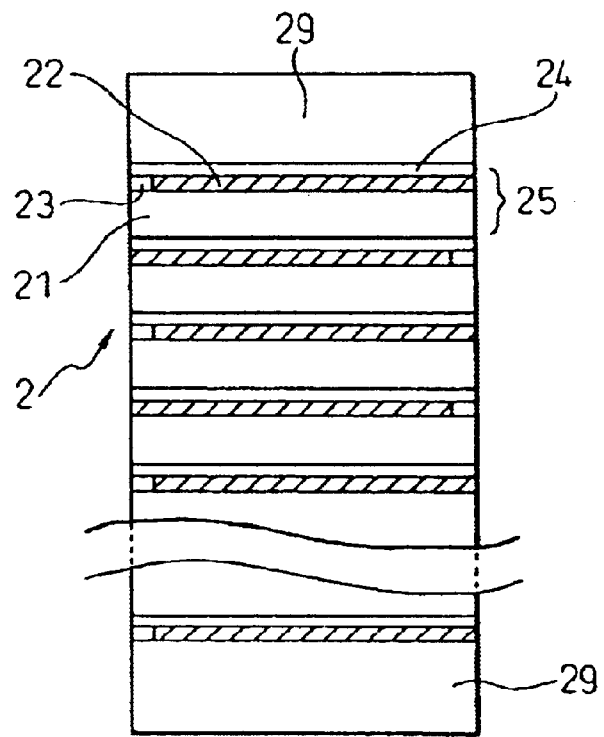
FIG. 10 is a sectional explanatory view of an unsintered stacked body in the stacking direction in Embodiment 1.

Reference numeral 21 contained in the unsintered unit 25 in FIG. 10 represents a green sheet for one ceramic layer 111, 112.

Next, each unsintered unit 25 is punched out from the large-scale green sheet 20 at the positions indicated by broken lines a and b or c and d as shown in FIG. 11.

The unsintered unit 25 is fitted into a positioning hole 320 of a jig 32 positioned below the large-scale green sheet 20 simultaneously with punching-out of the unsintered unit 25, and is stacked and bonded to other unsintered units 25 that have already been punched out.

Incidentally, the unsintered unit 25 that is first punched out is stacked and bonded to a green sheet 29 for the dummy layer.

Next, the punching-out operation will be explained.

The punching-out operation is carried out at the position at which a punching portion 31 connected to a press machine opposes a stacking table 33 for stacking the unsintered units 25 through the jig 32 having the positioning hole 320.

The positioning hole 320 of the jig 32, the punching-out portion 31, the stacking table 33 and the unsintered unit 25 before punching are laid out on a line.

The punching portion 31 is pushed down in the sheet of the drawing and one of the unsintered units 25 of the large-scale green sheet 20 is punched out through the positioning hole 320. The unsintered unit 25 is caused to fall toward the stacking table 33 simultaneously with its punching-out, and is bonded and stacked to the unsintered units 25 that have already been punched out and stacked on the stacking table 33.

Incidentally, the green sheet for the dummy layer, having a thickness of 200 µm, is set in advance before punching-out of the first unsintered unit 25.

This punching-out operation is carried out continuously while the punching-out portion 31, the jig 32 and the stacking table 33 are moved relative to the large-scale green sheet 20 in the interlocking arrangement.

After a required number of the unsintered units 25 are punched out, the green sheet for the dummy layer, having a thickness of 200 µm, is bonded.

After the process steps described above are completed, the unsintered stacked body 2 can be acquired as shown in FIG. 10.

Next, the unsintered stacked body 2 is put into a jig, is heated to 80° C. and is pressed and bonded by using a press machine. The pressure is $20 \times 10^4$ Pa at this time.

Degreasing is then conducted, and the unsintered stacked body 2 is sintered at 1,100° C. inside a sintering furnace.

After sintering, the outer peripheral surface and the upper and lower surfaces are subjected to surface grinding. Next, the side surfaces 101 and 102 on which the side electrodes 16 are to be disposed are subjected to surface grinding. The side surface electrodes 16 are fitted and then the lead-out lead wires 161 are bonded to the side surface electrodes 16. In this way the stacked ceramic body 1 of this example is obtained.

The outside of the stacked ceramic body 1 of this example obtained by the production method described above is examined. Thereafter, the stacked ceramic body 1 is cut and its section is also examined. It has been found from both of these tests that de-lamination and cracks do not occur in the stacked ceramic body 1 of this example, and the stacking condition is extremely good.

Next, the operation and effect of the stacked ceramic body of this example will be explained.

In the stacked ceramic body 1 of this example, the internal electrode layer 121, 122 having substantially the same thickness as the ceramic layer 111, 112 and the spacer 131, 132 are stacked on the ceramic layer 111, 112, and the adhesive layer 14 is further bonded to each of the internal electrode layer 121, 122 and the spacer 131, 132. The other ceramic layers 111 and 112 are stacked through the adhesive layers 14.

Therefore, the stacked ceramic body 1 has a uniform thickness as a whole and the difference in thickness does not occur. The adhesive layers 14 more reliably ensure bonding between the ceramic layers 111 and 112. Furthermore, the adhesive layers 14 can absorb the difference of thickness between the internal electrode layer 121, 122 and the spacer 131, 132.

When the production method according to this example is utilized, printing of the print portion 24 for the adhesive layer can absorb the difference of thickness between the print portion 22 for the internal electrode layer and the print portion 23 for the spacer. Therefore, the thickness of the unsintered stacked body and eventually, the thickness of the stacked ceramic body 1, in the stacking direction can be rendered uniform. The adhesive layers 14 can strongly bond the ceramic layers 111 and 112.

Because the slurry for the adhesive layer secures the bonding strength of the ceramic layers 111 and 112, the amount of the binder of the slurry for the ceramic layer may well be small. Therefore, the degreasing time and the sintering time of the unsintered stacked body 2 can be shortened.

Particularly because the punching-out operation of the unsintered units 25 and the formation of the unsintered stacked body by stacking and bonding the unsintered units 25 are simultaneously carried out, high production efficiency can be acquired.

As described above, this example can provide the stacked ceramic body in which de-lamination (inter-layer peel) does not easily occur, and the production method thereof.

Figure 12:
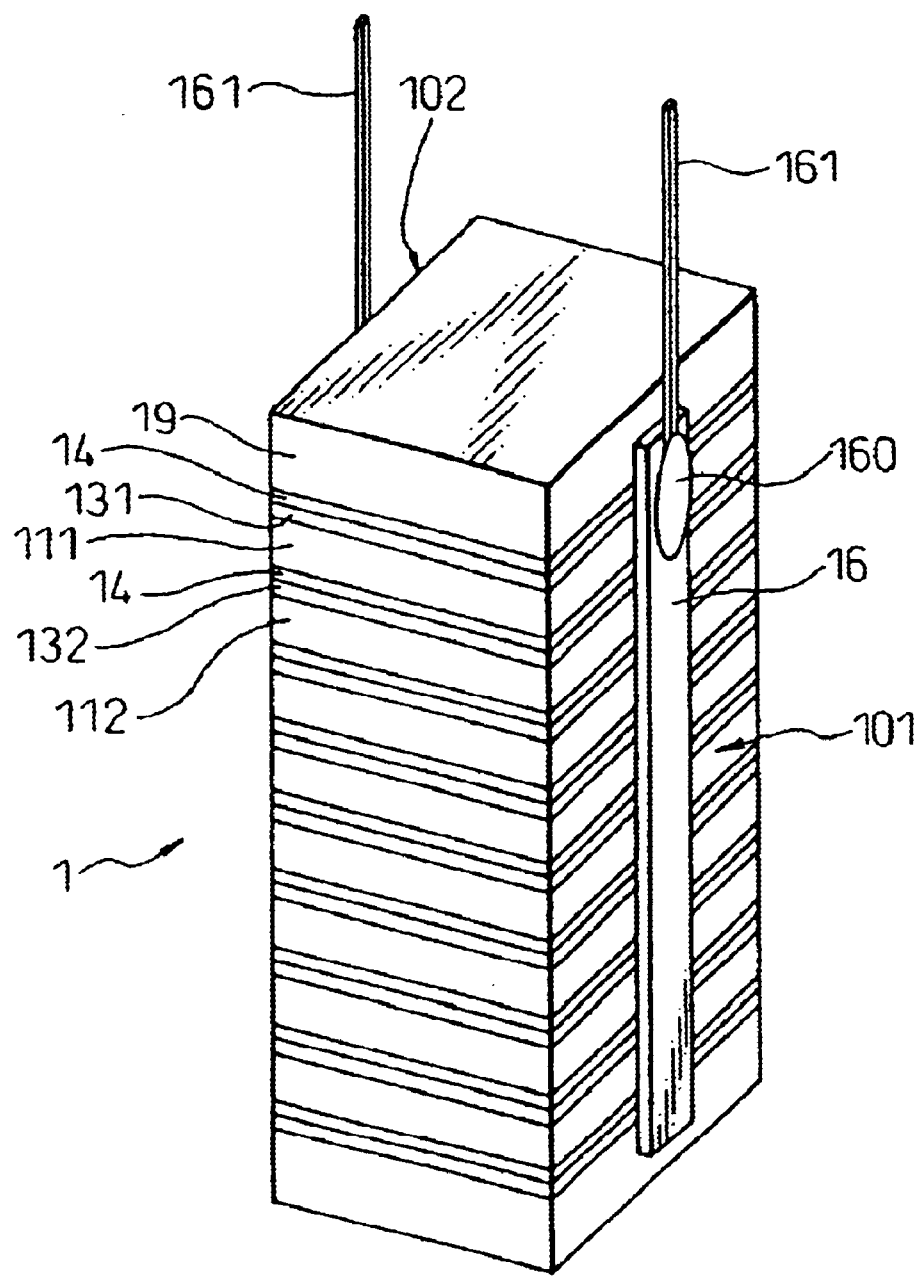
FIG. 12 is a perspective view of a stacked ceramic body having square ceramic layers in Embodiment 1.
Figure 13:
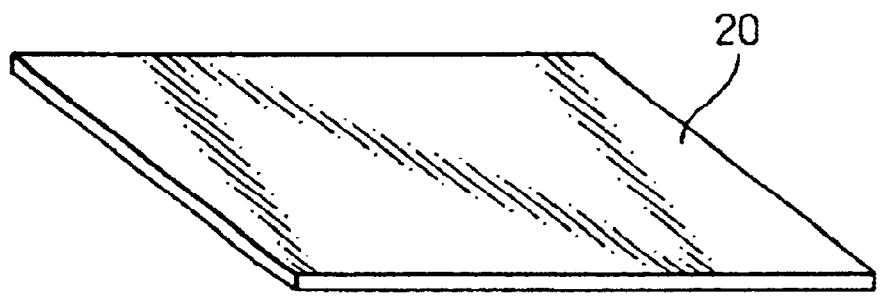
FIG. 13 is a perspective view of a large-scale green sheet in Embodiment 2.

The ceramic layers 111 and 112 of the stacked ceramic body 1 in this example have a barrel shape. However, the ceramic layers 111 and 112 may have a rectangular shape as shown in FIG. 12.

Other details are the same as those of the barrel-shaped stacked ceramic body 1 described above, and the same operation and effect can be obtained.

EXAMPLE 2

A production method of a stacked ceramic body of this example collectively forms each print portion 225, 235, 245 on a large-scale green sheet 20 as shown in FIGS. 13 to 16.

First, a large-scale green sheet 20 capable of providing a large number of unsintered units is prepared. Unlike Example 1, the green sheet 20 has a size capable of providing a plurality of unsintered units in both longitudinal and transverse directions.

Figure 14:
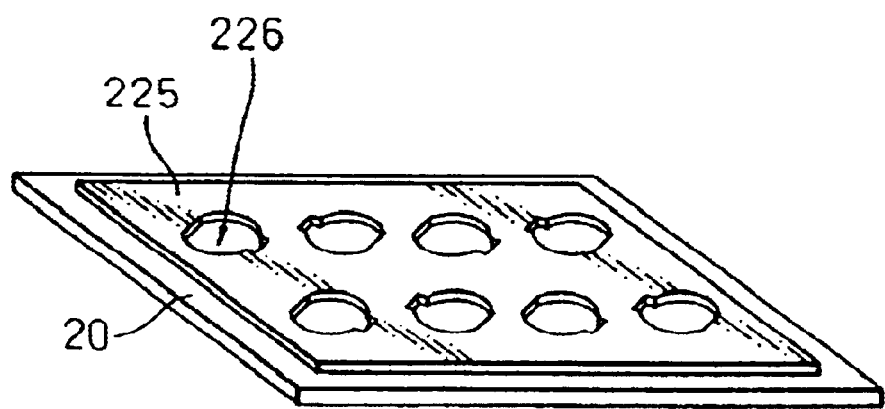
FIG. 14 is an explanatory view of a print portion for a spacer in Embodiment 2.

Next, a print portion 225 for the spacer is collectively printed to the large-scale green sheet 20 as shown in FIG. 14. The shape of the print portion 225 for the spacer is similar to that of the large-scale green sheet 20. The print portion 225 has a large number of recesses 226 in which print portions 235 for the internal electrode layer are disposed.

Figure 15:
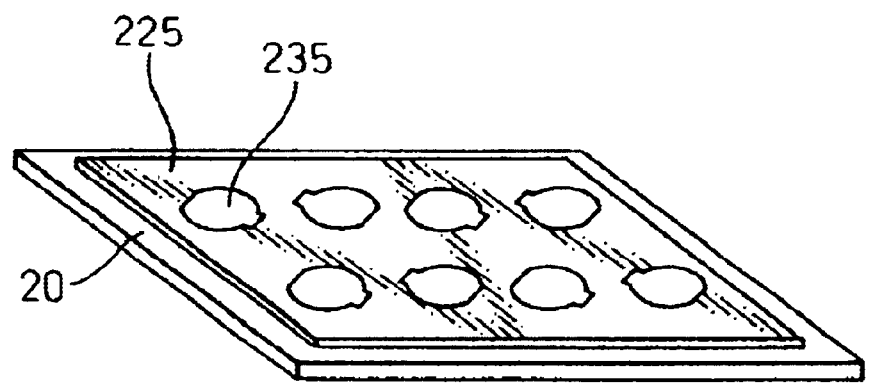
FIG. 15 is an explanatory view of a print portion for an internal electrode layer in Embodiment 2.

A paste for the internal electrode layer is filled into the recesses 226, and print portions 235 for the internal electrode layer are then disposed as shown in FIG. 15.

Figure 16:
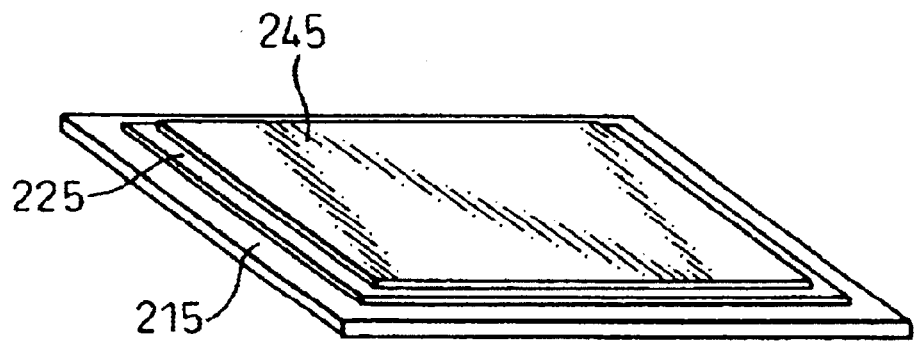
FIG. 16 is an explanatory view of a print portion for an adhesive layer in Embodiment 2.

Thereafter, a print portion 145 for the adhesive layer is disposed in such a fashion as to wholly cover the print portions 235 for the internal electrode layer as shown in FIG. 16.

Discrete unsintered units are obtained by utilizing the punching-out operation used in Example 1. The unsintered units are stacked and bonded to give an unsintered stacked body.

Alternatively, it is possible to punch out individual unsintered units to obtain a large number of unsintered units, to stack these unsintered units in a separate process step to obtain an unsintered stacked body and then to press and bond the unsintered stacked body to bond the unsintered units with one another.

The unsintered stacked body obtained in this way is then degreased and sintered to give a stacked ceramic body.

Other details are the same as those of Example 1, and the same operation and effect can be acquired as in Example 1.

EXAMPLE 3

In this example, an unsintered stacked body in which the spacer and the adhesive layer are integrated with each other will be explained with reference to FIGS. 17 and 18.

Figure 17:
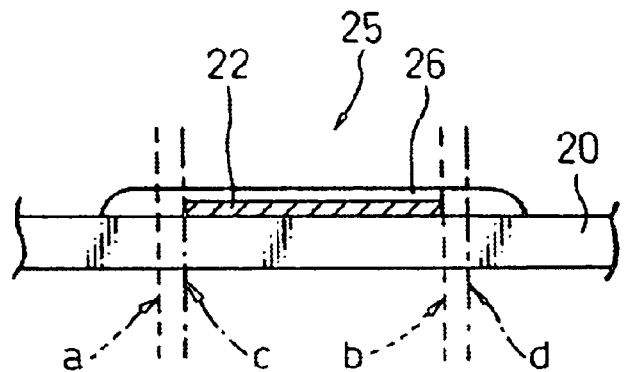
FIG. 17 is a schematic explanatory view of a large-scale green sheet in which print portions for spacers and for adhesive layers are integrally formed in Embodiment 3.

In this example, a print portion 22 for the internal electrode layer is provided to a large-scale green sheet 20 as shown in FIG. 17, and a print portion 26, for both a spacer and an adhesive layer, is formed in such a fashion as to cover the print portion 22.

Figure 18:
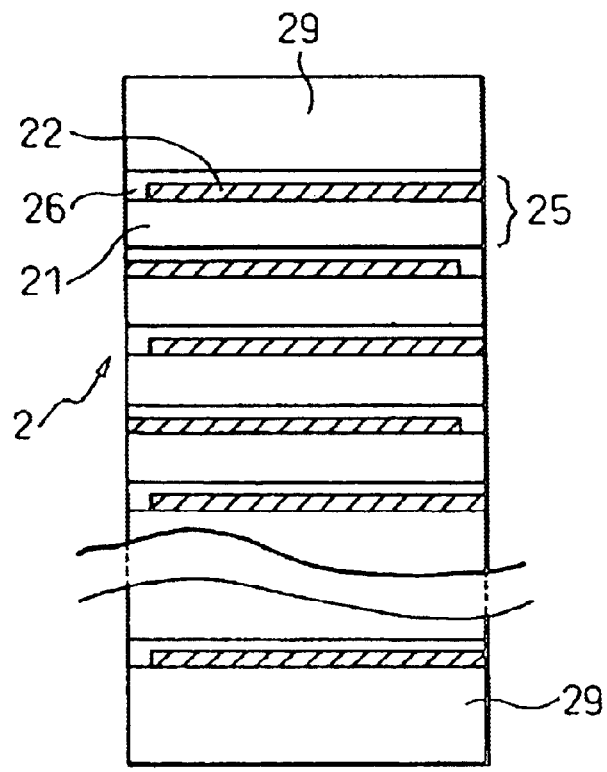
FIG. 18 is a sectional explanatory view of an unsintered stacked body in a stacking direction in Embodiment 3.

Discrete unsintered units are then obtained by utilizing the punching-out operation in the same way as in Example 1 and are then stacked and bonded to give an unsintered stacked body 2 as shown in FIG. 18.

Alternatively, it is possible to punch out individual unsintered units to obtain a large number of unsintered units, to stack these unsintered units in a separate process step to obtain an unsintered stacked body 2 as shown in FIG. 18 and then to press and bond the unsintered stacked body to bond the unsintered units with one another.

The unsintered stacked body 2 obtained in this way is then degreased and sintered to give a stacked ceramic body.

Other details are the same as those of Example 1.

According to the production method of this example, the adhesive layer and the spacer can be formed simultaneously. Therefore, the number of production steps can be reduced by one, and energy and labor can be saved.

As the adhesive layer and the spacer are formed integrally with each other, the spacer and the adhesive layer integrally cover the internal electrode layer. Therefore, de-lamination does not easily occur at the boundary with the internal electrode layer.

The same operation and effect can be obtained as in Example 1.

What is claimed is:

1. A stacked ceramic body in which ceramic layers and internal electrode layers are alternately stacked one on another, comprising a predetermined number of unit layers, each of said unit layers formed by stacking:

a ceramic layer and an internal electrode layer stacked on at least a part of a surface of said ceramic layer;

a spacer stacked on a surface of said ceramic layer at which said internal electrode layer is not formed, and having substantially the same thickness as said internal electrode layer; and adhesive layers stacked on a surface of said internal electrode layer and a surface of said spacer.

2. A stacked ceramic body according to claim 1, wherein said spacer and said adhesive layer are integrated with each other.

* * * * *